US008450047B2

(12) United States Patent
Heyderman et al.

(10) Patent No.: US 8,450,047 B2
(45) Date of Patent: May 28, 2013

(54) METHOD OF CONTROLLING THE STATES AND VORTEX CHIRALITY IN HEXAGONAL RING STRUCTURES COMPRISING NANOSCALE MAGNETIC ELEMENTS

(75) Inventors: Laura Heyderman, Zofingen (CH); Elena Mengotti, Zürich (CH); Danilo Zanin, Barbengo (CH); Rajesh Chopdekar, Zürich (CH); Hans-Benjamin Braun, Winterthur (CH); Remo Huegli, Wolfwil (CH); Gerard Duff, Shannon (IE)

(73) Assignee: Paul Scherrer Institut, Villigen (CH)

( * ) Notice: Subject to any disclaimer, the term of this patent is extended or adjusted under 35 U.S.C. 154(b) by 0 days.

(21) Appl. No.: 13/404,190

(22) Filed: Feb. 24, 2012

(65) Prior Publication Data

US 2012/0189964 A1    Jul. 26, 2012

Related U.S. Application Data

(63) Continuation of application No. 13/087,747, filed on Apr. 15, 2011.

(60) Provisional application No. 61/324,332, filed on Apr. 15, 2010.

(51) Int. Cl.
*G03C 5/00* (2006.01)
*G03F 7/20* (2006.01)
*G11C 11/00* (2006.01)
*G11C 13/00* (2006.01)

(52) U.S. Cl.
USPC ............ 430/311; 430/296; 430/942; 365/151

(58) Field of Classification Search
USPC .................. 430/296, 311, 942; 365/129, 151, 365/244
See application file for complete search history.

(56) References Cited

U.S. PATENT DOCUMENTS

| | | | |
|---|---|---|---|
| 5,613,140 A * | 3/1997 | Taira | 257/14 |
| 6,118,686 A * | 9/2000 | Taira et al. | 365/129 |
| 6,156,273 A * | 12/2000 | Regnier et al. | 422/70 |
| 6,166,948 A * | 12/2000 | Parkin et al. | 365/173 |
| 6,392,914 B1 * | 5/2002 | Kuroki et al. | 365/118 |
| 6,627,748 B1 * | 9/2003 | Ju et al. | 506/15 |
| 6,867,429 B1 * | 3/2005 | Lutz | 257/40 |
| 6,985,276 B2 * | 1/2006 | Taguchi et al. | 359/280 |
| 6,988,058 B1 * | 1/2006 | Sherwin et al. | 703/1 |
| 7,488,819 B2 * | 2/2009 | Manabe et al. | 540/472 |
| 8,085,578 B2 * | 12/2011 | Heyderman et al. | 365/151 |
| 2003/0017364 A1 * | 1/2003 | Kikitsu et al. | 428/693 |
| 2004/0028598 A1 * | 2/2004 | Harneit et al. | 423/445 B |
| 2004/0166673 A1 * | 8/2004 | Hutchison et al. | 438/686 |
| 2005/0037825 A1 * | 2/2005 | Faranda Cordella et al. | 455/575.9 |
| 2005/0128842 A1 | 6/2005 | Wei | 365/205 |
| 2007/0258161 A1 * | 11/2007 | Richter et al. | 360/48 |

* cited by examiner

*Primary Examiner* — Christopher Young
(74) *Attorney, Agent, or Firm* — Laurence A. Greenberg; Werner H. Stemer; Ralph E. Locher

(57) ABSTRACT

A method is provided for achieving specific magnetic states with a given vortex chirality in artificial kagome spin ice building block structures containing one or more hexagonal rings of ferromagnetic islands created with electron beam lithography, where a subgroup of the ferromagnetic islands have a smaller width and therefore higher switching field than the other normal (wider) islands and are placed at specific positions in each of the rings. The positioning of the islands determines the magnetic state of the building block structure during magnetization reversal, and determines the chirality of the magnetic vortices that occur in each ring.

6 Claims, 8 Drawing Sheets

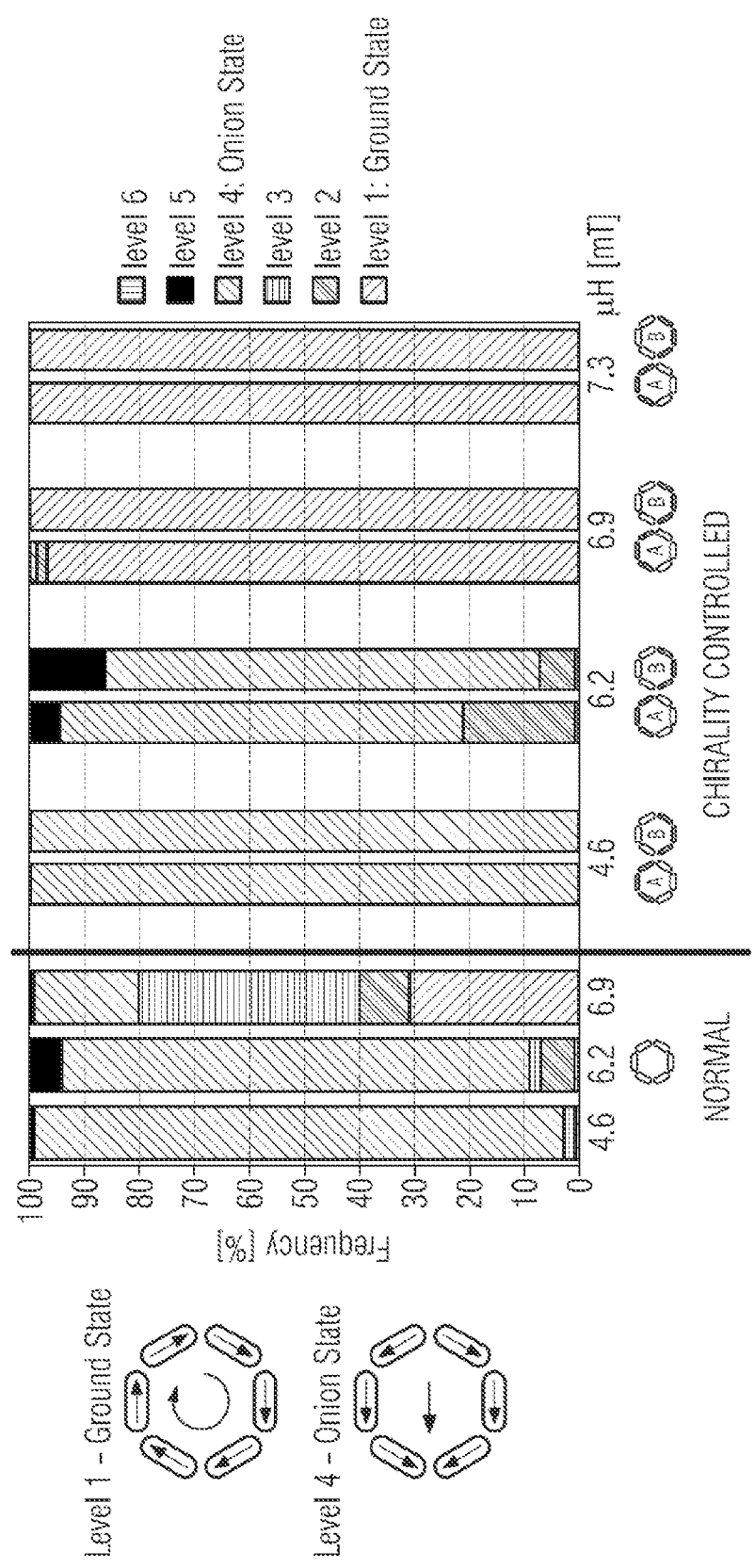

METHOD OF CONTROLLING THE STATES AND VORTEX CHIRALITY IN HEXAGONAL RING STRUCTURES COMPRISING NANOSCALE MAGNETIC ELEMENTS

CROSS-REFERENCE TO RELATED APPLICATION

This application is a continuation application of the formal application Ser. No. 13/087,747 filed Apr. 15, 2011; said formal application being herewith incorporated by reference in its entirety. Further, this application claims the priority, under 35 U.S.C. §119(e), of provisional application No. 61/324,332 filed Apr. 15, 2010; the prior application is herewith incorporated by reference in its entirety.

BACKGROUND OF THE INVENTION

Field of the Invention

Artificial frustrated spin systems, made up of dipolar-coupled ferromagnetic elements arranged in specific geometries on surfaces, are interesting both for scientific research but also for their potential as magnetic (spintronic) devices, for data storage and for information processing. A good example is given by the work of Elena Mengotti et al. on the kagome spin ice building blocks incorporated herein by reference in its entirety (Elena Mengotti et al. Building blocks of an artificial kagome spin ice: Photoemission electron microscopy of arrays of ferromagnetic islands. *Physical Review*, B 78:144402, 2008). The cited Mengotti article explains how dipolar energy calculations can be used to fully characterize the energy landscape of kagome spin ice building blocks, which have one, two or three hexagonal rings. With these energy calculations, the lowest energy states can be identified together with their degree of degeneracy. The investigated structures in the cited Mengotti article are created by electron beam lithography and are arranged in a particular geometry that is energetically highly frustrated: the kagome spin ice. Each of the investigated building blocks is composed of identical small islands placed on the sites of the kagome lattice. These islands are small enough so that, in the absence of a magnetic field, they are single domain and the magnetization points along the island long axis. For these reasons, the dipolar calculation can be applied. Using photo emission electron microscopy, Elena Mengotti et al. showed experimentally that following demagnetization, the ice rule at a three island vertex (i.e. two of the island moments point towards the vertex and one points away, or vice versa) is always obeyed even at low dipolar coupling, and that on increasing the number of rings in the building blocks, so introducing more frustration in the system, the ability to achieve the lowest energy state decreases drastically. So far, the low energy states could not be obtained in a controlled fashion. In other words, the frequency of the achieved low energy states (i.e. vortex state) with a given chirality in the one-ring kagome structure during in-situ magnetization reversal was purely random. With the help of lithography, some of the islands making up the building blocks can be modified.

The goal of the present invention is to increase the frequency of low energy states during functional reversal, such as magnetization reversal, and also to control the chirality of those particular states by introducing some asymmetry in the structures. These modifications, that concern particularly the width of the islands, will lead to a change in the switching field of the islands, which is high for thin islands or low for the wide islands. Choosing the right geometry one can control the reversal process in a reliable way. In order to confirm experimental results in the present invention, micromagnetic simulations using the Object Oriented Micro Magnetic Framework incorporated herein by reference in its entirety (M. J. Donahue and D. G. Porter. OOMMF User's Guide, Version 1.0, September 1999) have been carried out. A significant increase in the frequency of a particular energy state with a particular vortex chirality during the in-situ magnetization reversal is achieved. The present invention is therefore a first step toward the controlled use of these finite multistate kagome structures for future spintronic devices, either for memory applications or to perform logic operations.

This section will explain shortly the properties of a kagome spin ice and provide a description of the different energy states for the investigated building block structures.

2.1 Kagome Spin Ice.

FIG. 1 represents a kagome spin ice with the spins placed on the vertices of the kagome lattice. The spins are placed on the corners of the triangles that make up the lattice. A lattice constraint forces the spin to point along the connection between the centers of two neighboring triangles. The most important characteristic of this geometry is that it is energetically highly frustrated and that the three interactions at a three island vertex are equivalent. Frustration is present since at every vertex where three magnetic moments interact, all the involved dipolar interactions can not be satisfied simultaneously. In this situation, the spin ice rule dictates that either two moments point towards the triangle center and one points away (two-in/one-out), or vice-versa (one-in/two-out). More about kagome spin ice can be found in the work of Ballou incorporated herein by reference in its entirety (R. Ballou A. S. Wills and C. Lacroix. Kagome spin ice. Physical review, B 66:144407, 2002).

In order to create an artificial kagome spin ice, small elongated functional elements, such as ferromagnetic elements, are placed on the sites of the kagome lattice, so forming a honeycomb array. The functional islands, i.e. the ferromagnetic islands, used in this work are small enough to be single domain and therefore they can be described by a single macroscopic spin.

2.2 Energy State

The definition of the energy states for the kagome spin ice building blocks is fundamental to the interpretation of the experimental observation. For the functional mechanism of the ferromagnetic coupling, the energy can be calculated using the equation for dipolar energy, which for two island is given by (equation 2.1):

$$E(\vec{r}_1, \vec{r}_2, \vec{m}_1, \vec{m}_2) = \frac{1}{\|\vec{r}\|^3}\left[\vec{m}_1 \cdot \vec{m}_2 - \frac{3}{\|\vec{r}\|^2}(\vec{m}_1 \cdot \vec{r})(\vec{m}_2 \cdot \vec{r})\right]$$

where $\vec{m}_1$ and $\vec{m}_2$ are the magnetic moments of the two interacting islands and $\vec{r}$ is the distance between the centers of the islands. In our experiment the distance between the centers of the nearest islands is 500 nm and the moment of each island is of the order of $1\times10^8$ Bohr magnetons. This gives an interaction energy of $10^{-18}$ J between nearest neighbors. Taking into account the shape anisotropy, the moment is set in one of two directions parallel to the long axis of the island, and there are $2^N$ possible configurations, where N is the number of islands that make up a building block structure. For the single hexagonal ring building block structure N=6, for the two-ring structure N=11 and for the three ring structure N=15.

FIGS. 2A and 2B illustrate the calculated energy values from the work archived by E. Mengotti et al. for an artificial kagome spin ice geometry with identical islands made of cobalt. While a change in the island material or a modification of the geometry of some of islands may lead to slight shifts in energy, the relative energies of the different states will remain the same. For the one-ring kagome structure, six islands are present resulting in $2^6=64$ possible states and the energy levels are grouped in four bands, as illustrated in FIG. 2A. The minimum (maximum) dipolar energy occurs when neighboring moments are aligned head-to-tail (head-to-head or tail-to-tail). Therefore the ground state of a single ring consists of moments circulating either clockwise or anticlockwise. For the two-ring kagome structure, many more states are present ($2^{11}=2048$), and frustration is introduced at two vertices with three interacting islands oriented at 120° to each other. The ground state with a twofold degeneracy consists of two vortices with opposite chirality. The next highest energy state (very close in energy to the ground state) is the "external-flux-closure" state. Here the outer magnetic moments form a chain of moments circulating (head-to-tail) either clockwise or anticlockwise around the whole two-ring structure, and the central island moment points in one of the two possible directions resulting in a fourfold degeneracy. A summary of the lowest twelve energy states is illustrated in FIG. 2A. For the three-ring kagome structure, while two vortices are allowed, it is no longer possible to have three complete vortices. In total there are $2^{15}=32768$ configurations. The lowest energy band consists of two discrete levels. Level 1 corresponds to the ground state which consists of two vortices with opposite chirality and a third incomplete vortex. Level 2 is the "external-flux-closure" state with the outer magnetic moments forming a chain of moments circulating either clockwise or anticlockwise around the whole three-ring structure and the three moments in the middle of the structure following the ice rule. In FIG. 2B the configurations for the first two energy levels and the energy landscape for the three-ring building block structure is illustrated.

FIG. 2A: Left: Calculated dipolar energies of the 64 (2048) possible configurations of the one- (two-) ring building blocks. The energy values refer to 10 nm-thick cobalt islands with lattice parameter a=500 nm, width W=200 nm, and length L=470 nm for the one- (two-) ring building blocks. Right: Schematic representation of one of the degenerate states for each of the one-ring building block energy levels and the first twelve of the two-ring building block energy levels. The states are ordered according to increasing energy and labeled (n-m), where n refers to the highest number of neighboring magnetic moments pointing in the same direction around the structure, and m is the number of neighboring magnetic moments pointing in the opposite direction, running clockwise from the starting point indicated with a dot and arrow. For higher states the nomenclature k-l-m-n is used to indicate the number of neighboring moments aligned in the same direction.

FIG. 2B: Energy characterization of the three-ring kagome structure. Calculated dipolar energies of the lowest 204 energy states of the three-ring structure. The energies of all of the 32768 possible states are shown in the inset. The lowest two energy states, which belong to the first energy band, are schematically shown at the top of the figure: the moment configuration for the ground state is shown on the left, while the moment configuration for the external-flux-closure state is shown on the right.

Employing Photoemission Electron Microscopy (PEEM) together with x-ray magnetic circular dichroism (XMCD), the magnetic configurations in three basic building blocks of an artificial kagome spin ice consisting of one, two, and three ring structures during magnetization reversal have been observed. The structures were fabricated with electron beam lithography and consisted of islands of identical size (called normal building blocks) or with some narrower islands (chirality-controlled structures). The narrower islands require a higher applied magnetic field to switch their magnetic moments compared with the field required for the normal islands.

In general terms, it has to be emphasized that the states and vortex chirality in hexagonal ring structures comprising single domain nanoscale magnetic elements (or islands) can be controlled by a modification of the dimensions of some of the islands to alter the field at which the magnetic moments switch, i.e. the so-called switching field. For example, when the islands are made narrower, they will have a higher switching field. It is also considered within the scope of the present invention that similar systems containing clusters of other coupled functional elements, with each element having carefully tuned properties, work in a similar manner so that particular states can be better achieved by carefully tuning the behaviour of each element in the cluster. Therefore, instead of interaction via magnetic fields, the coupling between such elements may be by means of electrical, chemical, optical or some other type of interaction, and there exists one or more elements in such a given magnetically, electrically, chemically, mechanically or optically coupled structure with different magnetic, electrical, chemical, mechanical or optical properties. Also, it is feasible that the properties of each element are not fixed, but can be interactively modified. For example, if the islands are manufactured from multiferroic materials, where the magnetization responds to an electric field, an electric field could be used to interactively change the magnetic properties of the individual islands and therefore the field required to switch them.

Experimentally it is shown that an advantageous choice of the position of the narrow islands in the kagome spin ice structure increases significantly the ability to achieve the low energy states. In particular, the frequency of achieved low energy states during magnetization reversal has been significantly improved with the control of the island switching field and therefore which particular state of a series of degenerate states will be obtained and, in particular, the control of the vortex chirality. In addition, the chirality-controlled building blocks reverse their magnetization in a small field range. This behavior has been also reproduced using OOMMF simulations. This work opens the way to control the magnetic states of dipolar coupled island structures for future spintronic applications.

A method is described here for achieving specific states of functionally coupled islands of a functional material, said functionally coupled island being placed within a chirality-controlled kagome spin ice structure, each ring structure having six islands with their long axis at 120° to their neighbors and created, for example, by lithographic means. Each of the functionally coupled islands is oriented along one of the six sides of the hexagonal ring structure of said kagome spin ice component, wherein the functionally coupled islands are substantially identical but differ in a given property, so providing a mechanism in which the energy state and chirality is controlled according to the physical property of functionally coupled islands.

In the method of the present invention, the physical property of the functional material is selected from a group consisting of:

a) magnetic dipole orientation within the islands with a magnetic dipolar coupling between the islands;

b) electric dipole orientation within the islands with an electric dipolar coupling between the islands;

c) ferroelectric orientation within the islands with a ferroelectric coupling between the islands;

d) filled vesicles interlinked by springs with tunable spring constants providing a mechanical coupling;

e) molecular orientation with an interaction between the molecules;

f) molecular charge or spin with an interaction between them;

g) molecules with chemical or physical links; and h) polarized light absorption with plasmonic interactions through the supporting surface or matrix.

The magnetic island structures are separated by a distance of about 500 nm and impart an interaction energy of $10^{-18}$ J between nearest structures. In a preferred embodiment the island structures have a substantially constant length.

Preferably, the probability of achieving a particular energy state with a particular vortex chirality of a kagome spin ice component is increased with a change in property of said functionally coupled islands. For the case of ferromagnetic islands, the size, and therefore the field required to switch the magnetic moment, can be modified in order to generate islands having, for example, a smaller width and therefore a larger switching field than other neighboring ones, in order to realize a well-defined low energy state of the artificial kagome spin ice hexagonal ring structures.

In one embodiment, the first subgroup of said island structures have a given property and a second subgroup of said island structures have a modification to that property compared with the first subgroup, wherein the first property is greater than the second property. For example, if the islands are ferromagnetic, one can have two subgroups of islands with different widths and therefore different switching fields.

The method includes island structures having at least two subgroups, wherein a first subgroup of said island structures have a first property and a second subgroup of said island structure have a modified property, wherein the first property is greater than the second property.

In one embodiment, the island structures have more than two subgroups.

A particular distinguishing feature over the prior art is the fact that the functional islands have different values of the same property within the same honeycomb ring structure. Thereby, the islands show a different behavior with respect to their physical property and with respect to the energy required to change the status of a functionally coupled island from a first state into a second state, for example different applied magnetic fields required to change the direction of the ferromagetic magnetization by modifying the island width. Therefore, the low energy states of the kagome spin ice structure and the vortex chirality can be controlled, allowing the storage or processing of information in the kagome spin ice structure more precisely and more predictably.

Other features which are considered as characteristic for the invention are set forth in the appended claims.

Although the invention is illustrated and described herein as embodied in a method of studying chirality-controlled artificial kagome spin ice building blocks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 4C is a plot of the frequency distribution visualized at different field values for 200 normal one-ring structures and 200 chirality-controlled one-ring structures, including the control of both anti-clockwise and clockwise vortices, for a horizontally applied magnetic field.

DESCRIPTION OF THE INVENTION

Methods and Software

The method used for the sample fabrication is explained together with the magnetic imaging techniques and the simulation framework. Artificial kagome spin ice structures made up of ferromagnetic thin film islands are created with electron beam lithography in combination with lift-off processing. Additionally, the method used to investigate the magnetization orientation in the single domain ferromagnetic islands that make up the kagome spin ice building blocks is explained, namely photoemission electron microscopy (PEEM) combined with x-ray magnetic circular dichroism (XMCD). With the help of an object oriented micro magnetic framework (OOMMF) it is possible to simulate the behavior of the building block structures upon magnetization reversal.

3.1 Sample Fabrication

Figure 3A:
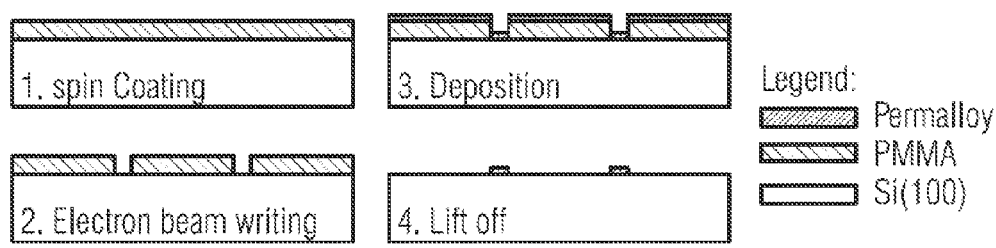
FIG. 3A is a representation of the step-by-step fabrication of the artificial kagome spin ice building block structure with electron beam lithography.

The sample for the Photoemission Electron Microscope (PEEM) study is fabricated on a 10×10 mm Si(100) substrate with a thickness of 500 μm. The fabrication makes use of electron beam lithography in combination with lift-off processing and the whole process consists of four main steps shown in FIG. 3A and is summarized below.

The first step is to spincoat polymethyl methacrylate (PMMA) resist on the Silicon substrate. After spin coating, the resist is exposed with the desired geometry using an electron beam writer and developed to create holes in the resist where it was exposed to the electron beam. In order to transfer the pattern in the resist into the desired thin film material, a thin film of permalloy (Ni80Fe20) with the desired thickness is deposited on top of the sample using dc magnetron sputtering. The final lift-off step involves ultrasound-assisted removal of the unwanted magnetic film and polymer resist in acetone. A quality control of the finished sample with scanning electron microscopy (SEM) is mandatory before the experiments are performed. With this fabrication technique, the island geometry as well as the ferromagnetic material can be controlled and, in particular, the different configurations for experiments used in the present invention are created.

3.2 Magnetic Imaging Method

The orientation of the magnetic moments in a ferromagnetic domain can be visualized using the photoemission electron microscopy (PEEM) together with the x-ray magnetic circular dichroism (XMCD). Due to the XMCD effect in a ferromagnetic material, a difference in spectroscopic absorption depending on the chirality of the incoming x-ray beam exists. The effect is highest at the L-edges (2p-3d transition) of transition metals such as cobalt, nickel and iron. The emitted electrons are then collected and imaged with a photoemission electron microscope, with the image recorded by a CCD camera behind a multi channel plate. To get an image, the x-ray energy is set to the $L_3$ absorption edge and a division of the two images taken with opposite polarization (i.e. circular plus and circular minus) gives the final contrast. A black contrast indicates that the magnetic moments are parallel to the x-ray beam while in a region with white contrast, they are antiparallel. Intermediate gray contrast indicates that the magnetic moments have an intermediate angle to the x-rays. Since the islands have a uniform magnetization and the magnetic moment can either be parallel or at ±60° or ±120° to the x-rays, it is possible to determine the magnetic configuration in an artificial kagome spin ice building block from a single image. The magnetic imaging was carried out at the Surface/Interface Microscopy (SIM) beam line of the Swiss Light Source (SLS) and the Elmitec PEEM used for the experiments is shown schematically in FIG. 3B.

A limitation of this technique is that it is difficult to image magnetic configurations in the presence of an applied magnetic field, which would deflect the electrons used for imaging. Therefore magnetization reversal is always studied by taking images at remanence, reducing the field to zero after its application.

Figure 3B:
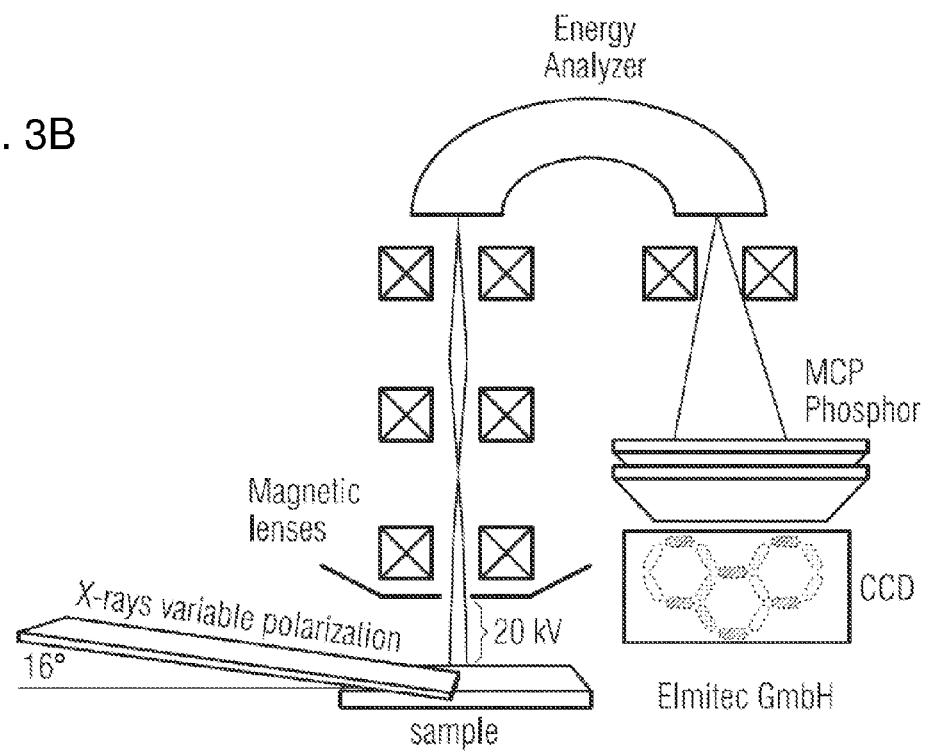
FIG. 3B is a schematic of the photoemission electron microscope at the SIM beamline of the Swiss Light Source.

FIG. 3B: Schematic set up of the PEEM at the SIM beamline of the SLS. Circularly polarized x-rays illuminate the sample. The emitted secondary electrons are accelerated by an applied voltage of 20 kV and then collected by the PEEM electron optics. The image is recorded with a CCD camera.

Results

The sample characterization, the results achieved on magnetization reversal and the OOMMF simulations are discussed herein below.

4.1 Sample Characterization

Figure 1:
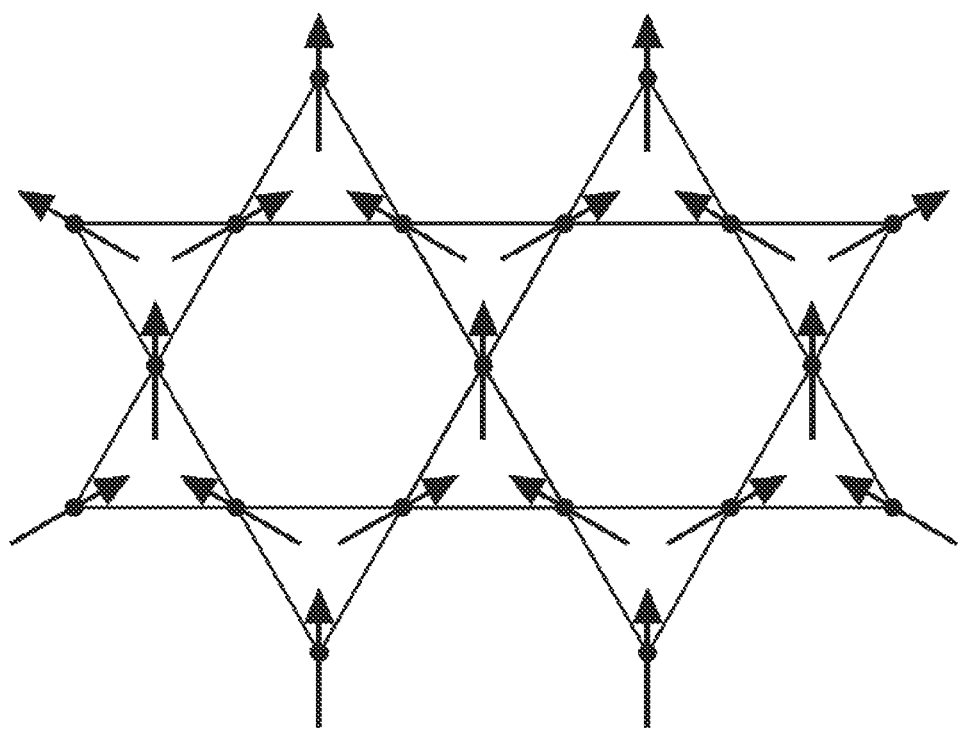
FIG. 1 is a schematic representation of a 2D kagome spin ice structure and represents a kagome lattice, and spins (arrows shown in black) placed at the corners of the triangles that make up the lattice.
Figure 2A:
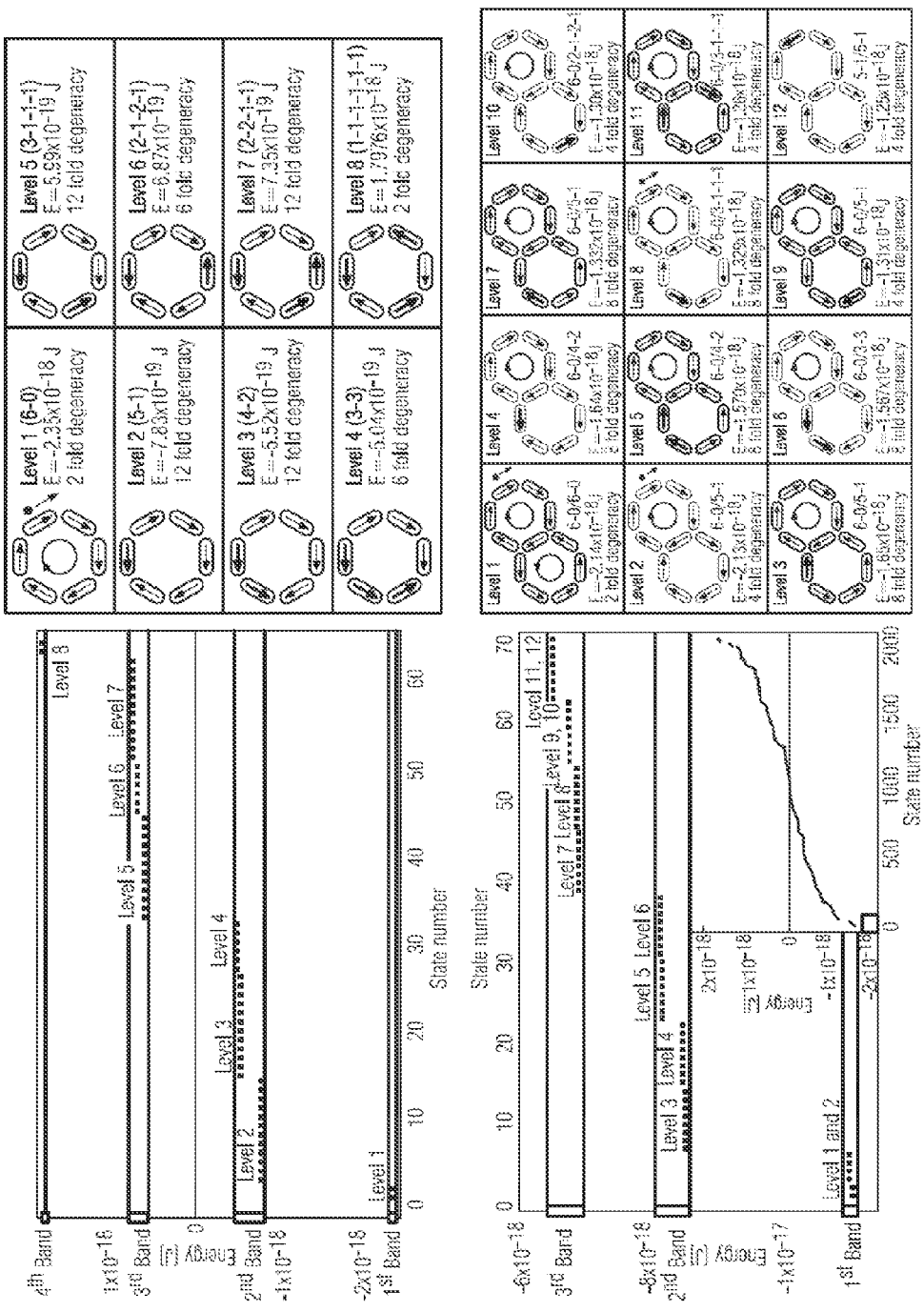
FIG. 2A: Left: Calculated dipolar energies of the 64 (2048) possible configurations of the one- (two-) ring building block. The energy values refer to 10 nm-thick cobalt islands with a=500 nm, W=200 nm, L=470 nm for the one- (two-) ring building block. Right: Schematic representation of one degenerate state for each of the one-ring building block energy levels and the first twelve of the two-ring building block energy levels.
Figure 2B:
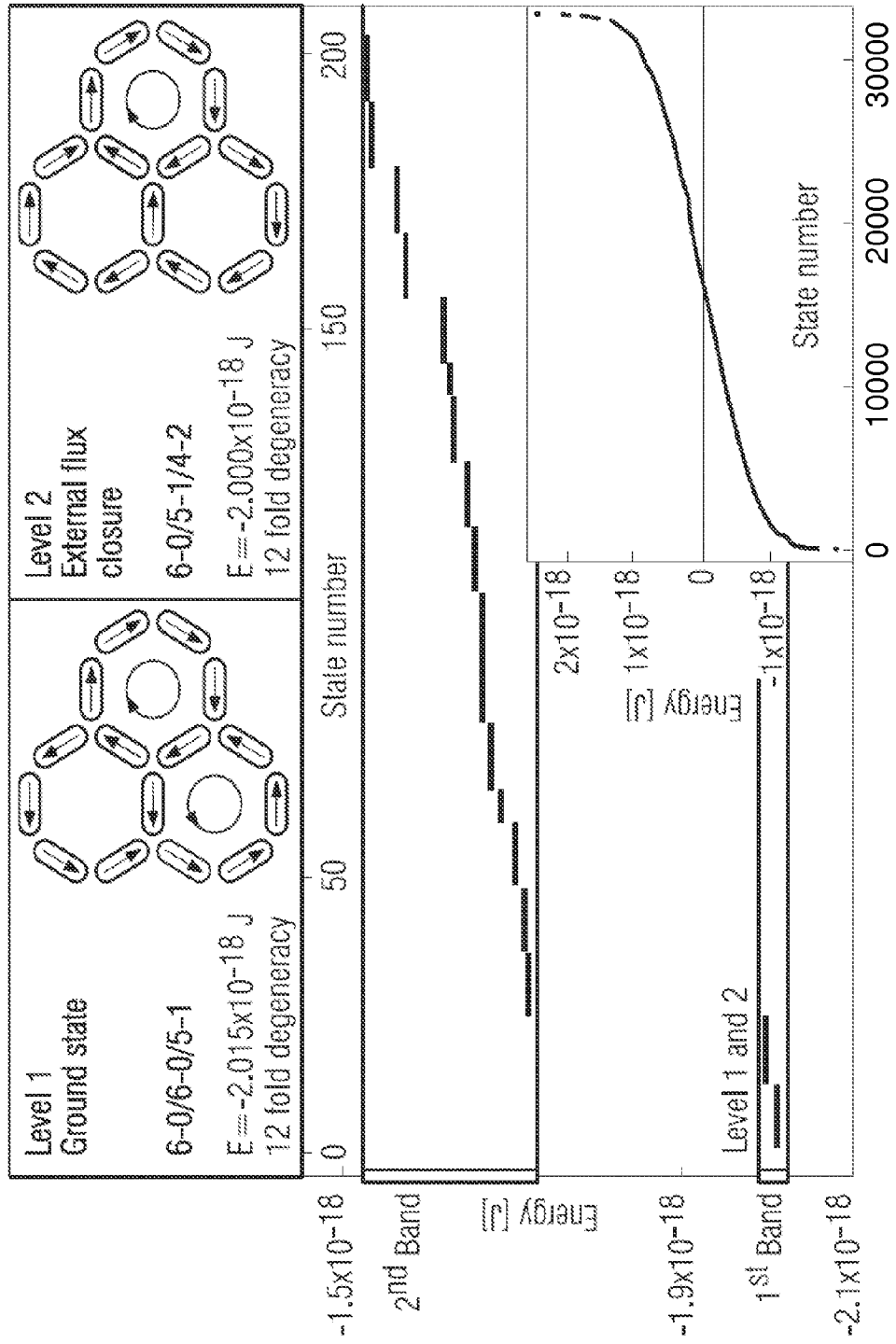
FIG. 2B is the dipolar energy characterization of the three-ring kagome structure.

As cited herein, in the work by Elena Mengotti and colleagues, the islands that make up the kagome building block structures all have the same size, namely a width of 170 nm, a length of 470 nm and a uniform thickness of 30 nm. In a highly dipolar coupled case, the distance between island centers corresponds to 500 nm (i.e. the width of a hexagonal ring was set to 1 μm). In order to induce a particular state with a specific vortex chirality, some asymmetry was introduced in the islands that make up the building blocks. For instance, in the one-ring building block structure, three of the six islands which are placed above the horizontal axis are thinner, so that the field required to switch their magnetic moment is higher. In our experiment the thinner islands have a width of 130 nm while the length is kept approximately constant. A change in width of only 23% leads, to a significant increase in the frequency of a particular state during magnetization reversal as will be shown later herein. In contrast to the one-ring building block, where only the lowest energy vortex state can be investigated, in the two- and three-ring building blocks, the thinner islands can be placed in different ways. The position of the thinner islands is chosen so that during the magnetization reversal, the building blocks fall into one of the two lowest energy states, either the ground state or the external-flux-closure state as shown in FIGS. 2A and 2B.

Figure 4A:
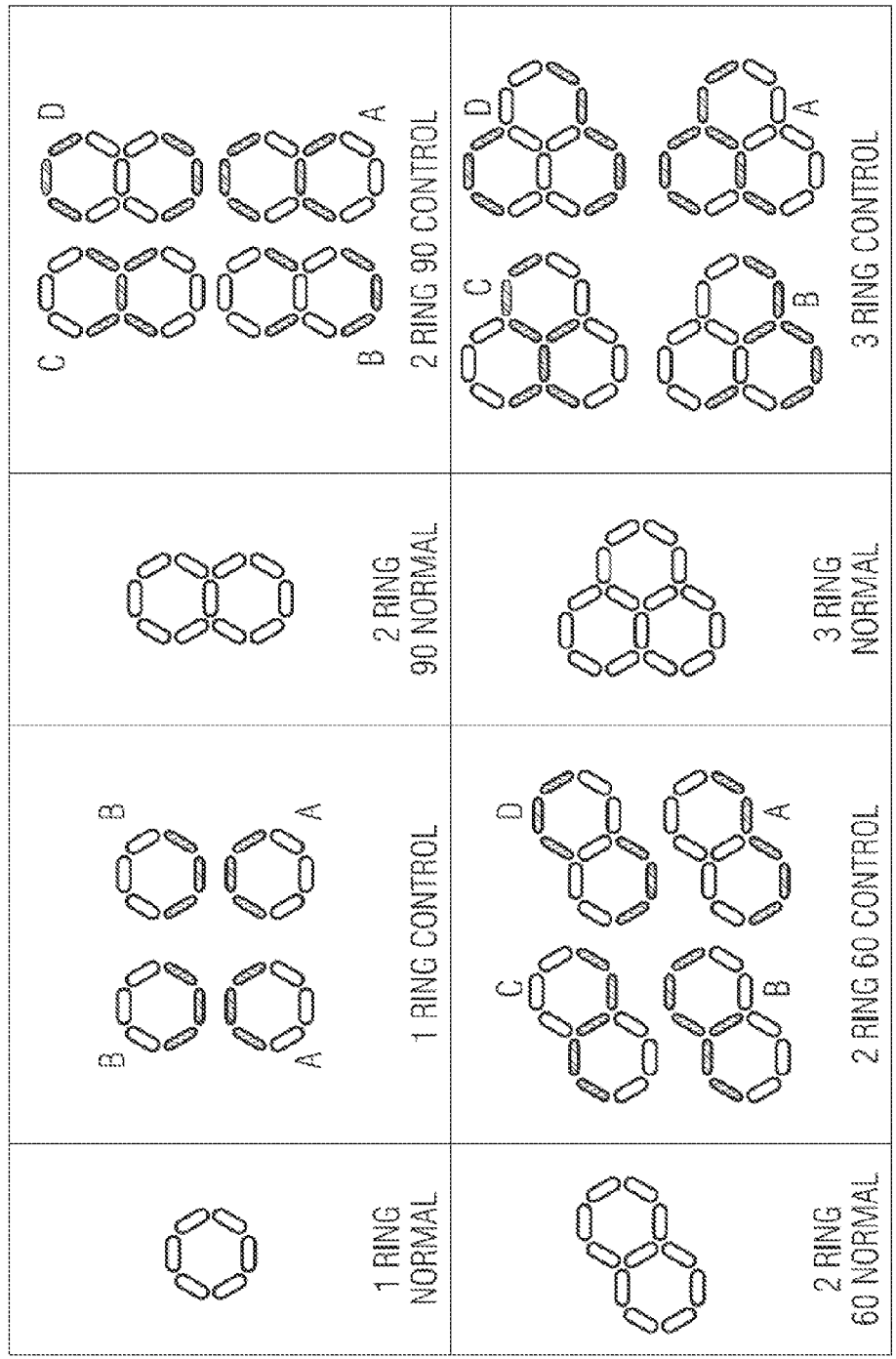
FIG. 4A is the schematic of the building blocks investigated in the frame of the present invention.

In order to control the magnetic states and vortex chirality of the building block structures, some of the normal islands are replaced with thinner islands, which have higher switching fields. Therefore there are in total two possibilities for control of the one-ring structures and four possibilities for control of the two- and three-ring structures. A schematic comparison between the normal and chirality-controlled structures is shown in FIG. 4A. Note that, while the control geometries shown are very effective, there are other possibilities for controlled geometries, for example, modifying a different number of islands or having more than two different island widths.

FIG. 4A: Schematics of the building blocks investigated in the frame of this work. In the columns to the left are the previously investigated so-called "normal" building block structures with all islands identical. In the columns to the right, the chirality-controlled structures are shown. The white islands are the normal (wider) islands, with the same size as the previous ones (width=170 nm), while the black islands are now made thinner (width=130 nm) and therefore require a larger applied magnetic field to switch them. The film thickness is the same for all structures (30 nm).

In order to fully characterize the sample, the finished chip has to be investigated with Scanning Electron Microscopy. Each building block type investigated is reproduced many times in four separated arrays containing the same structure types. Fifty structures of the one-ring (1 R) building blocks; sixteen structures of the two-ring building blocks with the long axis (ring centre to ring centre) oriented at 60° to the vertical direction (2R60); sixteen structures of the two-ring building block with the long axis at 90° to the horizontal direction (2R90) and sixteen structures for the three-ring (3R) building block exist on the same sample. In each experiment 100 structures of 1R, 64 of 2R60, 64 of 2R90 and 64 structures of 3R are observed for each field value, with a set of normal structures and chirality-controlled structures. In order to increase the statistics, the whole layout (i.e. 1 R, 2R60, 2R90 and 3R) is repeated in order to double the number of investigated structures.

Figure 4B:
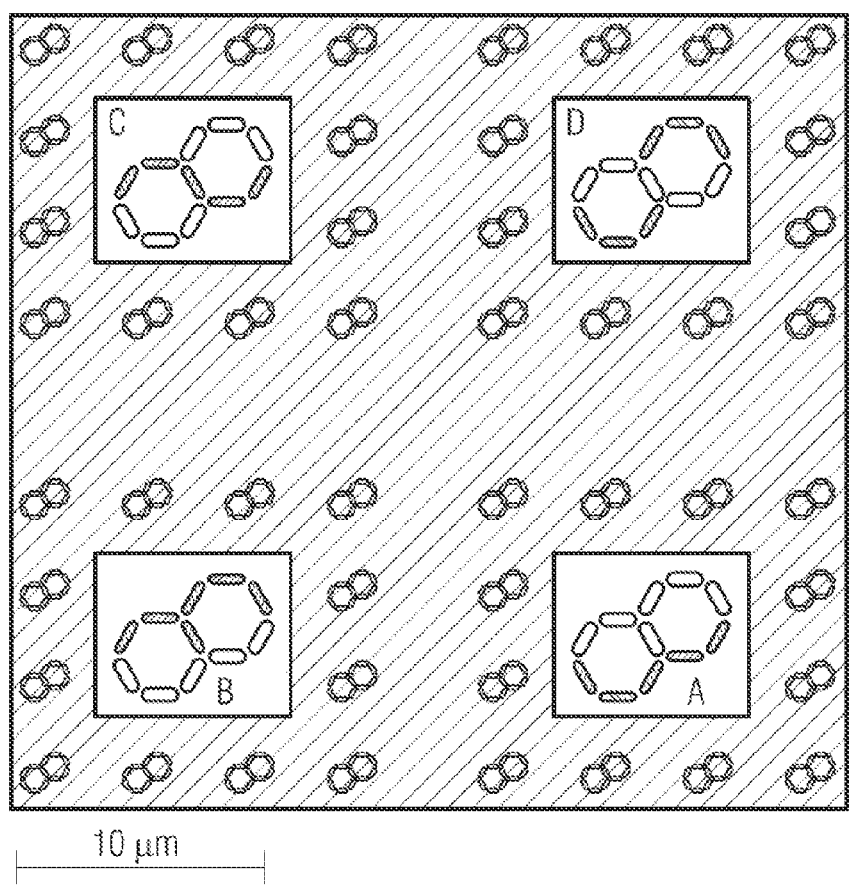
FIG. 4B shows the layout of part of a sample, namely the 2R60 chirality-controlled structures that were shown in FIG. 4A.

FIG. 4B shows the layout of a sample, namely the 2R60 chirality-controlled building blocks, where the same layout as that shown in FIG. 4A is used.

XMCD/PEEM Experiment

From a single XMCD/PEEM image, the magnetic configuration of each building block structure can be determined. Since each of the islands that make up the building block structure is single domain and since the magnetization is parallel to the island long axis, with the XMCD it is possible to determine the magnetic configuration with a single image.

If the magnetic moment is either parallel or antiparallel to the x-ray polarization vector, the ferromagnetic domains will appear black or white, whereas for all the other moment orientations the contrast will be gray. The possible moment orientations are thus the following with the x-ray direction pointing to the right: black means magnetic moment parallel to the x-ray direction and pointing to the right, dark gray means magnetic moment at ±60° to the x-ray direction, light gray means magnetic moment at ±120°, and white means magnetic moment antiparallel to the x-ray direction, pointing to the left. The four contrast levels in a single XMCD image allow the unequivocal determination of the magnetic states.

In-situ Magnetization Reversal

The magnetization reversal was performed by starting with a fully saturated configuration where the island moments pointed towards the left (islands with white and light grey contrast) or pointed towards the right (islands with black and dark grey contrast). This was achieved by applying a large magnetic field by passing current through a filament coil placed in the sample holder under the sample. In the starting configuration, all the rings are in the so-called onion-state (level 4 for the one-ring building block). Then the magnetic field was applied in the reverse direction, increasing the field in steps and images were taken after each field step at remanence i.e. on reducing the field to zero. The field amplitude was increased until the reverse magnetization in the whole sample was reached: i.e. the sample is fully saturated in the opposite direction compared to the starting one. Magnetization reversal was performed in both directions. During the magnetization reversal of normal building blocks structures, significantly fewer than 100% of the building block structures pass through the low energy states and, on increasing the ring number, the frequency of low energy states decreased. With the chirality-controlled structures of the present invention, increases in the frequency of low energy states are achieved and also it is possible to control exactly which of the low energy states with a particular vortex chirality will be achieved upon magnetization reversal. In fact, by looking at the results achieved with the XMCD/PEEM experiment on the chirality-controlled one-ring building block structures, one can see that 100% of the intended states are achieved and the comparison between normal and controlled 1R building blocks is shown in FIG. 4C.

The results showed in the FIG. 4C clearly show the increase of frequency of low energy states observed during reversal for the one-ring chirality-controlled structure. Also remarkable is the fact that all the chirality-controlled building blocks reverse their magnetization in a relatively small field range. This behavior has been observed for all the different building blocks investigated.

FIG. 4C: Frequency distribution visualized at different field values during magnetization reversal for 200 normal one-ring structures and 200 chirality-controlled one-ring structures (both anticlockwise and clockwise). The applied magnetic field is generated by applying a current between 0.6 Ampere and 0.95 Ampere. The corresponding magnetic field is then given by the equation: $\mu_0 H[mT]=7.66*I[A]+0.03$ which has been extracted from a calibration measurement before the experiment.

To see the total percentage of structures that pass through the lowest energy state upon reversal, the present invention takes into account that the low energy state is seen at a particular field value and it is checked whether at the subsequent/previous field steps more structures pass through the low energy state. This provides the percentage of structures that pass through the low energy states and the different values for all the structures are given in the Table 4.2.

Figure 4D:
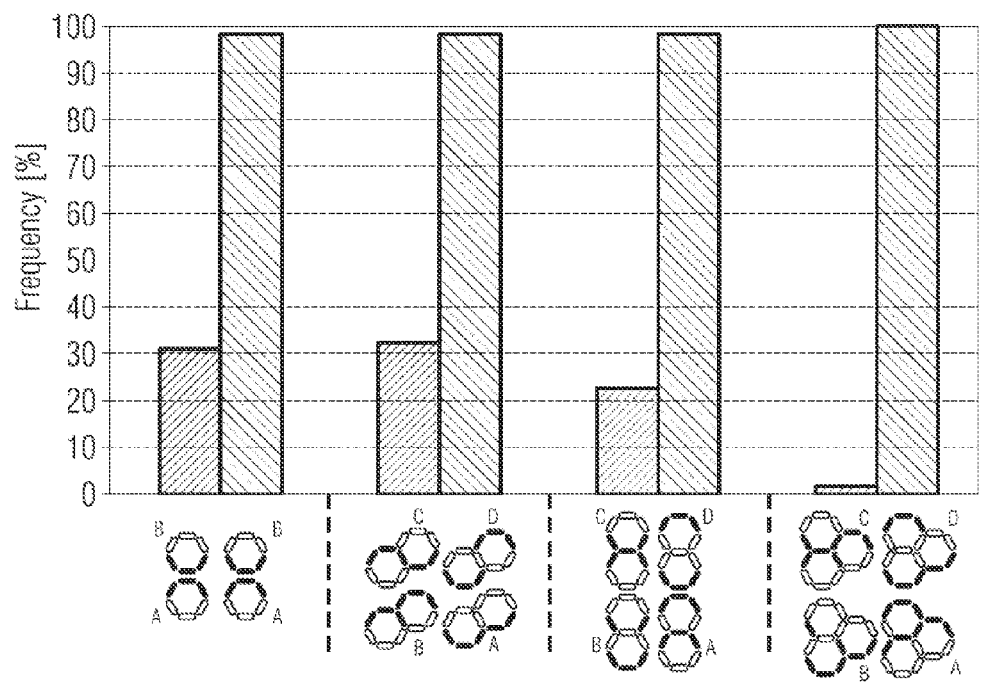
FIG. 4D shows the frequency of structures observed to pass through the low energy states during magnetization reversal for building blocks with different numbers of rings, and for normal kagome spin ice building block structures (left bars) and chirality-controlled ones (right bars). The magnetic field is applied horizontally.

FIG. 4D: Frequency of structures passing through the low energy states during magnetization reversal plotted against the number of rings for normal kagome spin ice building blocks (left bars) and chirality-controlled building blocks (right bars). Below the plot, the layout of all chirality-controlled building blocks is shown.

TABLE 4.2

| Structure type | Expected Energy State | Success in % | Error % |
|---|---|---|---|
| 1 Ring Normal | Level 1 | 31 | ±3 |
| 1 Ring Control A | Level 1 (ac) | 100 | ±0 |
| 1 Ring Control B | Level 1 (c) | 97 | ±2 |
| 2 Ring 60 Normal | Level 1 or Level 2 | 32 | ±2 |
| 2 Ring 60 Control C | Level 1 (c – ac) | 100 | ±0 |
| 2 Ring 60 Control D | Level 1 (ac – c) | 100 | ±0 |
| 2 Ring 60 Control A | Level 2 (ac) | 100 | ±0 |
| 2 Ring 60 Control B | Level 2 (c) | 93 | ±3 |
| 2 Ring 90 Normal | Level 1 or Level 2 | 22 | ±4 |
| 2 Ring 90 Control C | Level 1 (c – ac) | 100 | ±0 |
| 2 Ring 90 Control D | Level 1 (ac – c) | 96 | ± |
| 2 Ring 90 Control A | Level 2 (ac) | 96 | ±3 |
| 2 Ring 90 Control B | Level 2 (c) | 100 | ±0 |
| 3 Ring Normal | Level 1 or Level 2 | 1 | ±1 |
| 3 Ring Control C | Level 1 (c – ac – x) | 100 | ±0 |
| 3 Ring Control D | Level 1 (ac – c – x) | 100 | ±0 |
| 3 Ring Control A | Level 2 (ac) | 100 | ±0 |
| 3 Ring Control B | Level 2 (c) | 100 | ±0 |

Table 4.2: Percentage of all the investigated building blocks that pass through a low energy state during magnetization reversal. In the column for the expected energy state, the information in parenthesis (c = clockwise, ac = anti-clockwise and x = 4-2 structure) indicate the ring configuration obtained when assuming that the start configuration has moments pointing to the left (i.e. white contrast). Please refer to FIG. 4A for the structure type.

TABLE 4.3

| Type of building block | Passes through expected energy state | Error in % |
|---|---|---|
| 1 Ring Normal | 31 | ±3 |
| 1 Ring Control | 98.5 | ±1 |
| 2 Ring 60 Normal | 32 | ±4 |
| 2 Ring 60 Control | 98.3 | ±1 |
| 2 Ring 90 Normal | 22 | ±4 |
| 2 Ring 90 Control | 98 | ±1 |
| 3 Ring Normal | 1 | ±1 |
| 3 Ring control | 100 | ±0 |

Table 4.3: Percentage of all the investigated building blocks that pass through the low energy state, i.e. ground state or external-flux-closure.

In the table 4.2 the percentage of successfully reached ground states (level 1) or external flux enclosure states (level 2) is given for both normal and chirality-controlled cases of the different building blocks. The levels are given in FIGS. 2A and 2B, and the structure type is given in FIG. 4A. The percentages given are calculated over all undamaged structures, i.e. more than 99% of the fabricated structures. In order to summarize the high improvement achieved with the chirality-controlled structures, it is useful to compare the frequency for the normal building blocks with the sum over all (two for the one-ring structure and four for the two- and three-ring structures) types of the controlled building blocks. This is listed in Table 4.3 and shown in FIG. 4D.

4.3 OOMMF Simulations

OOMMF simulations have been performed to support the experimental results. For all the simulations, parameters for a ferromagnetic material, permalloy (Ni80%Fe20%), were employed as given in Table 4.6.

TABLE 4.6

| | |
|---|---|
| Saturation Magnetization [A/m] | $M_s = 860 \times 10^3$ |
| Exchange stiffness [J/m] | $A = 1.3 \times 10^{-11}$ |

TABLE 4.6-continued

| | |
|---|---|
| Gyromagnetic Ratio [m/A s] | $\gamma = 2.21 \times 10^5$ (default value used) |
| Damping Coefficient | A = 0.5 (default value used) |

Table 4.6: Parameters employed for permalloy in the OOMMF simulations.

Comparison between the simulations of the normal and chirality-controlled building blocks reveal the significant changes in the path for the reversal. The chirality-controlled structures achieve the expected lowest energy state every time, while the normal building block demonstrate an inability to pass through any low-energy state.

Figure 4E:
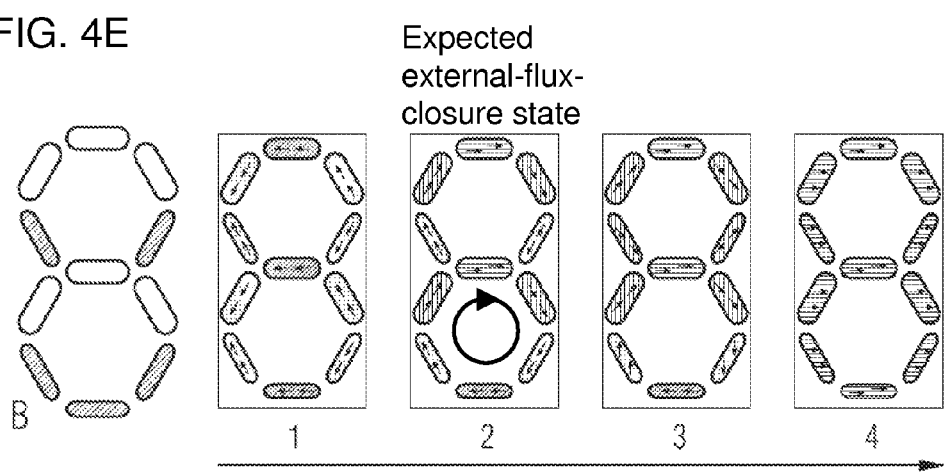
FIG. 4E shows the main steps of an OOMMF simulation of a two-ring structure with the structure long axis (ring centre to ring centre) at 90° to the applied magnetic field.

FIG. 4E: Main steps of an OOMMF simulation of a two-ring chirality-controlled structure (2 Ring 90 Control B) with long axis (ring centre to ring centre) at 90° to the applied field. These simulations support the experimental results with magnetization reversal occurring via the expected low energy state.

Conclusions

Building on the work of Elena Mengotti et al., the present invention has proven that building blocks composed of identical elongated ferromagnetic islands placed on the sites of the kagome lattice do not pass through the low energy states with a very high frequency and their states cannot be controlled.

By changing the size of some islands and therefore the field required to switch their magnetic moments, the present invention opens the possibility to observe a large amount of specific low energy states with a given vortex chirality. In the studies relating to the present invention on in-situ magnetization reversal, it is shown that the probability of achieving a particular state and controlling the vortex chirality of a building block can be significantly increased. The frequency of one-ring structures that pass through a vortex state with desired chirality is 98.5% and this increases even further for the two-ring and the three-ring structures up to the maximum of 100%. The comparison between normal structures and controlled building blocks reveal, in addition, a reduction of the field range in which the building blocks switch. This is an important property for any future application. It is believed that the behavior strongly depends on the position of the controlling islands and the final state is highly affected by the details of the structure geometry. With the help of OOMMF simulations, the studies herein are able to reproduce the experimental result, proving the success in going through the low energy state upon magnetization reversal for the controlled building blocks, while the normal structures do not succeed.

While the invention has been described in its preferred form or embodiment with some degree of particularity, it is understood that this description has been given only by way of example and that numerous changes in the details of construction, fabrication, and use, including the combination and arrangement of parts, may be made without departing from the spirit and scope of the invention.

The invention claimed is:

1. A method for achieving specific states of functionally coupled islands of a functional material, the method comprising the following steps:
    providing a chirality-controlled kagome spin ice structure;
    placing a functionally coupled island within the kagome spin ice structure, the placing step resulting in each ring structure having six islands with their long axis at 60° to adjacent kagome spin ice structures;
    orienting each of the functionally coupled islands along one of the six sides of the hexagonal ring structure of the kagome spin ice component, the functionally coupled islands being substantially identical but differing in at least one physical property of a functional material coupled in the functionally coupled islands;
    the functionally coupled island structures providing a mechanism with energy state and vortex chirality controlled according to the physical property of a functional material in the functionally coupled islands.

2. The method of claim 1, which further comprises selecting the physical property of the functional material from a group consisting of:
    a) magnetic dipole orientation within the islands with a magnetic dipolar coupling between the islands;
    b) electric dipole orientation within the islands with an electric dipolar coupling between the islands;
    c) ferroelectric orientation within the islands with a ferroelectric coupling between the islands;
    d) filled vesicles interlinked by springs with tunable spring constants providing a mechanical coupling;
    e) molecular orientation with an interaction between the molecules;
    f) molecular charge or spin with an interaction between them;
    g) molecules with chemical or physical links; and
    h) polarized light absorption with plasmonic interactions through the supporting surface or matrix.

3. The method of claim 1, wherein the kagome spin ice structure has an energy state and vortex chirality defined by a property modification of said functionally coupled islands.

4. The method of claim 1, wherein a first subgroup of said island structures have a first property and a second subgroup of said island structure have a modified property, and the first property is greater than the second property.

5. The method of claim 4, wherein the island structures have more than two subgroups.

6. The method according to claim 1, which further comprises performing the step of orienting by lithography.

* * * * *